US012707971B2

(12) United States Patent
Sharma et al.

(10) Patent No.: US 12,707,971 B2
(45) Date of Patent: Aug. 11, 2026

(54) TRANSISTOR-SCALE THERMOELECTRIC DEVICES FOR REFRIGERATION OF INTEGRATED CIRCUITS

(71) Applicant: Intel Corporation, Santa Clara, CA (US)

(72) Inventors: Abhishek Anil Sharma, Portland, OR (US); Wilfred Gomes, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 292 days.

(21) Appl. No.: 17/712,054

(22) Filed: Apr. 1, 2022

(65) Prior Publication Data

US 2023/0317553 A1 Oct. 5, 2023

(51) Int. Cl.

| | |
|---|---|
| ***H10W 40/28*** | (2026.01) |
| ***H10D 84/01*** | (2026.01) |
| ***H10D 84/03*** | (2025.01) |
| ***H10D 84/83*** | (2025.01) |
| ***H10W 40/00*** | (2026.01) |
| *H10N 19/00* | (2023.01) |

(52) U.S. Cl.

CPC ........ *H10W 40/28* (2026.01); *H10D 84/0158* (2025.01); *H10D 84/038* (2025.01); *H10D 84/834* (2025.01); *H10W 40/037* (2026.01); *H10N 19/00* (2023.02)

(58) Field of Classification Search

CPC ........ H10H 10/01; H10N 10/13; H10N 10/17; H10N 19/00; H10N 10/01; H10D 30/024; H10D 30/62; H10D 84/0158; H10D 84/0193; H10D 84/834; H10D 84/853; H10D 86/011; H10D 86/215; H10D 84/83; H10W 40/00; H10W 40/20; H10W 40/28

See application file for complete search history.

(56) References Cited

U.S. PATENT DOCUMENTS 7,893,529 B2 * 2/2011 Hsu ........................ H01L 23/481 257/713
2010/0176506 A1 * 7/2010 Hsu ........................ H10N 19/00 257/E23.101
2014/0246066 A1 * 9/2014 Chen ...................... H10N 10/01 136/212
2017/0012194 A1 * 1/2017 Wang ..................... H10N 10/01
2023/0091603 A1 * 3/2023 Sato ....................... H10N 10/17 136/201
2023/0207421 A1 * 6/2023 Then ...................... H01L 23/38 136/201

FOREIGN PATENT DOCUMENTS

WO WO 2020/214091 * 10/2020 ............. H01L 35/32

* cited by examiner

*Primary Examiner* — Mary A Wilczewski
(74) *Attorney, Agent, or Firm* — Essential Patents Group, LLP

(57) ABSTRACT

Thermoelectric (TE) devices and their manufacture on integrated circuit (IC) dies to improve thermal performance. An IC die may include a substrate with transistors on one side, a heat spreader on a second side, and a TE device between them. The TE device may have TE elements with similar dimensions as transistor features. An IC die with transistor circuitry blocks in multiple areas of an IC die may include TE devices between each of the transistor circuitry blocks and a heat spreader.

11 Claims, 10 Drawing Sheets

700

789 788 702

716 778 777 M12

779 753

752 M11

M10 754

M9

704 M8

M7

M6

M5

M4/V3

M3/V2

M2/V1

M1

V0 M0

C1

713 C0 712 701

744 711

733

750 714

BM0

BM1

751

754

705 BM2

MIM

753

BM3

755

706 Bump

TRANSISTOR-SCALE THERMOELECTRIC DEVICES FOR REFRIGERATION OF INTEGRATED CIRCUITS

BACKGROUND

There is an ongoing need for improved computational devices to enable ever increasing demand for modeling complex systems, providing reduced computation times, and other considerations. In some contexts, scaling features of integrated circuits has been a driving force for such improvements. Other advancements have been made in materials, device structure, circuit layout, and so on.

In typical implementations, computational systems are deployed with at least passive cooling. However, there is a growing desire to deploy systems with active cooling to meet a need for increased computational capabilities as discussed above.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. The accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1A:
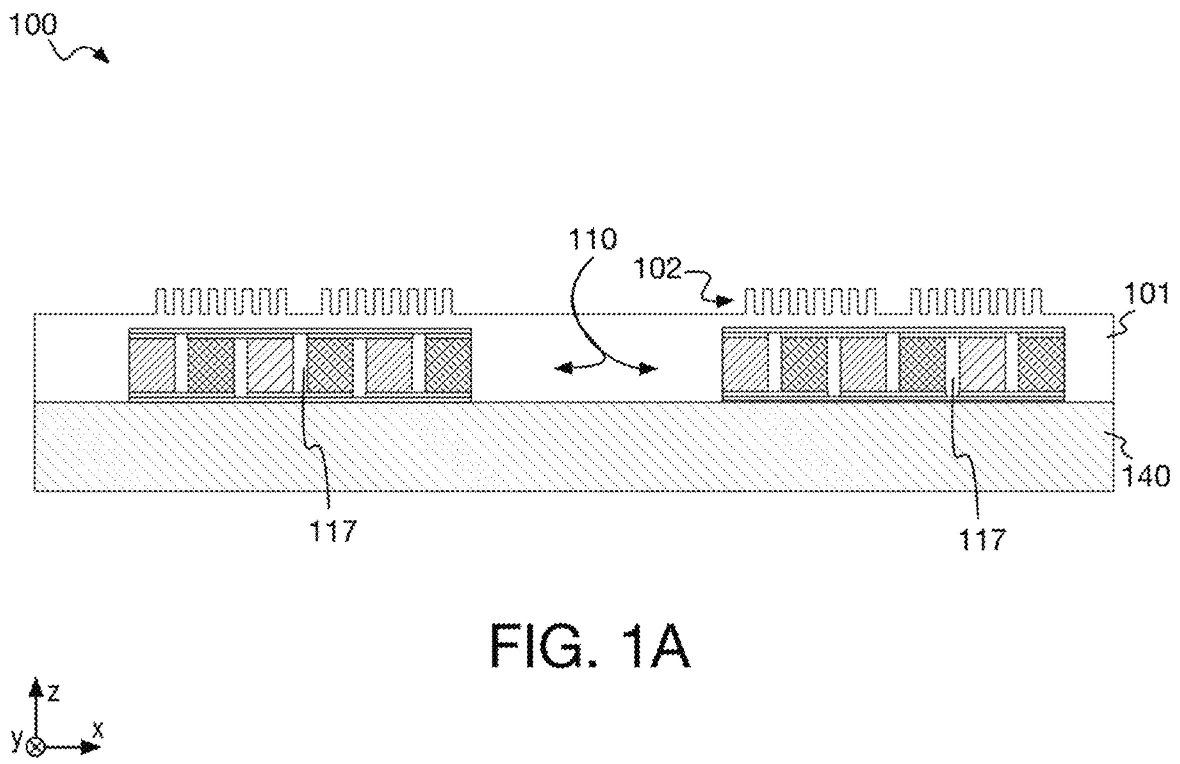
FIG. 1A illustrates a cross-sectional profile view of an example IC die, including thermoelectric devices beneath transistor fins.

In the following detailed description, reference is made to the accompanying drawings that show, by way of illustration, specific embodiments in which the claimed subject matter may be practiced. These embodiments are described in sufficient detail to enable those skilled in the art to practice the subject matter. The various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled.

In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over," "to," "between," and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The terms "coupled" and "connected," along with their derivatives, may be used herein to describe structural relationships between components. These terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The term "circuit" or "module" may refer to one or more passive and/or active components that are arranged to cooperate with one another to provide a desired function. The term “signal” may refer to at least one current signal, voltage signal, magnetic signal, or data/clock signal. The meaning of “a,” “an,” and “the” include plural references. The meaning, of “in” includes “in” and “on.”

The vertical orientation is in the z-direction and recitations of “top,” “bottom,” “above,” and “below” refer to relative positions in the z-dimension with the usual meaning. However, embodiments are not necessarily limited to the orientations or configurations illustrated in the figure.

The terms “substantially,” “close,” “approximately,” “near,” and “about,” generally refer to being within +/−10% of a target value (unless specifically specified). Unless otherwise specified in the specific context of use, the term “predominantly” means more than 50%, or more than half. For example, a composition that is predominantly a first constituent means more than half of the composition is the first constituent (e.g., <50 at. %). The term “primarily” means the most, or greatest, part. For example, a composition that is primarily a first constituent means the composition has more of the first constituent than any other constituent. A composition that is primarily first and second constituents means the composition has more of the first and second constituents than any other constituent.

Unless otherwise specified the use of the ordinal adjectives “first,” “second,” and “third,” etc., to describe a common object, merely indicate that different instances of like objects to which are being referred and are not intended to imply that the objects so described must be in a given sequence, either temporally, spatially, in ranking or in any other manner.

For the purposes of the present disclosure, phrases “A and/or B” and “A or B” mean (A), (B), or (A and B). For the purposes of the present disclosure, the phrase “A, B, and/or C” means (A), (B), (C), (A and B), (A and C), (B and C), or (A, B and C).

Views labeled “cross-sectional,” “profile,” and “plan” correspond to orthogonal planes within a cartesian coordinate system. Thus, cross-sectional and profile views are taken in the x-z and y-z planes, and plan views are taken in the x-y plane. Typically, profile views in the x-z plane are cross-sectional views. Where appropriate, drawings are labeled with axes to indicate the orientation of the figure.

Integrated circuit (IC) dies, systems, and techniques described herein relate to the use and manufacture of thermoelectric (TE) devices on IC dies to improve thermal performance. Improved thermal performance can in turn improve, computational performance. As high temperatures can damage ICs, device reliability can also be improved.

TE devices offer the benefits of not requiring moving parts and allowing for reversible modes of operation, including both cooling and TE generation modes. In cooling mode, an applied voltage drives a current through the TE device, which generates a temperature differential across the device proportional to the voltage (and current). The direction of the generated temperature gradient depends on the polarity of the applied voltage (and the direction of the input current). In TE generation mode, the TE device generates a voltage proportional to a temperature differential across the device. The polarity of the output voltage (and the direction of the current) depends on the direction of the temperature gradient. Design considerations for TE devices in cooling mode include current consumption and self-heating due to this current. The effectiveness and efficiency of a TE cooler can be improved by reducing its self-heating. In some embodiments of the present disclosure, an IC die includes a plurality of transistors, a heat spreader, and a TE device between them with alternating TE elements having dimensions on a scale similar to that of the transistors. By nanoscaling a TE device, its efficiency (and so its figure of merit, ZT) can be improved, in some cases even by a factor of two or more. Reducing the scale of the TE elements can greatly reduce self-heating of the TE device, particularly when dimensions are on the order of an electron’s mean free path length within a TE element. Although reducing any dimension of the TE elements can reduce self-heating, a greater improvement can be achieved by reducing all TE element dimensions.

Reducing TE device dimensions also allows for positioning TE devices nearer heat sources, which can further improve thermal performance by minimizing thermal transients at the hottest parts of an IC die. In some embodiments, TE devices are formed very near, e.g., within an electron’s mean free path length or less from, transistor channels. In some embodiments, a TE device is at or near the scale of transistor features, and more particularly are near the dimensional scale of a transistor channel. In some such embodiments, heat spreaders are also located very near transistor channels (e.g., within an electron’s mean free path length, or a small multiple of such a length).

Multiple TE devices can be used to further improve thermal performance. In some embodiments, multiple TE devices are thermally coupled to separate circuits, each having a dedicated TE device beneath them. In some embodiments, multiple TE devices coupled to separate power supplies. In some embodiments, multiple TE devices are independently controlled by separate controllers. In some embodiments, some TE devices operated in TE generation mode while others are concurrently operated in a cooling mode to enhance control of a group of TE devices. In some embodiments, individual TE devices are thermally coupled to individual heat spreaders.

Processes for manufacturing TE devices on IC dies are disclosed. In some embodiments, material is removed from the back-side of an IC die to allow a TE device to be formed very near transistor channels. Some materials and structures will be described that can synergistically enhance nanoscaled TE devices. In some embodiments, additional active-cooling structures are thermally coupled to the TE devices to help minimize the operating temperature of the IC die and its transistors. As used herein, the term “active-cooling structure” indicates a device that uses power to provide cooling (e.g., via flow of a coolant, immersion in a coolant, by the thermoelectric effect, etc.). Besides reducing the magnitude of thermal transients, lower operating temperatures can have other beneficial effects on thermal performance, e.g., by increasing electrical conductivity and electron mean free path lengths, which can further improve TE device performance. In some embodiments, active-cooling structures are on the IC die. In some embodiments, active-cooling structures are connected to the IC die at a package level.

Figure 1B:
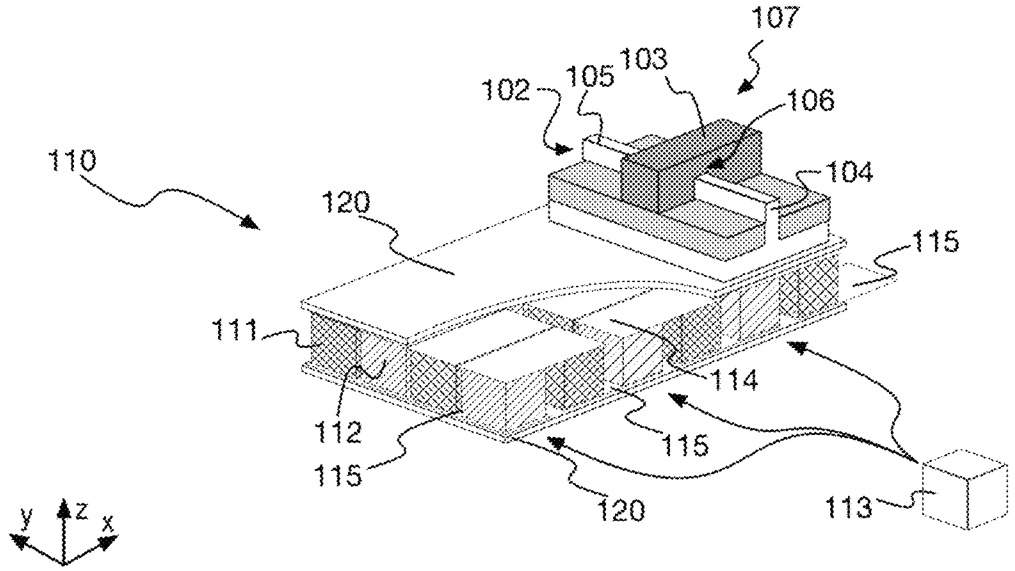
FIG. 1B illustrates an isometric projection of a thermoelectric device beneath a transistor, in accordance with some implementations of the present disclosure.

FIG. 1A illustrates a cross-sectional profile view of an example IC die 100, including TE devices 110 beneath transistor fins 102, and FIG. 1B illustrates an isometric projection of TE device 110 beneath a transistor 107, in accordance with some implementations of the present disclosure. As shown in FIG. 1A, IC die 100 has TE devices 110 directly beneath transistor fins 102. FIG. 1A shows a cross-sectional profile view of IC die 100 with arrays of fins 102, e.g., of multiple transistors, on a substrate 101. Fins 102 stand vertically (the z-direction) and run in the y-direction through the x-z viewing plane. FIG. 1B shows fin 102 connected to a gate structure 103, source 104, and drain 105 (all shown in transistor 107 over TE device 110). Fin 102 includes channel portions 106 (obscured by gate structures 103) for transistor 107. In FIG. 1A, a heat spreader 140 is below and thermally coupled to substrate 101. TE devices 110 are above heat spreader 140 and directly beneath fins 102 with channel portions 106, embedded within substrate 101. Heat spreader 140 extends beneath the first and second circuitry blocks, in first and second areas of IC die 100, respectively, and beyond. TE devices 110 can be electrically powered to operate as active coolers, transferring thermal energy downward from fins 102 to the back-side (i.e., heat spreader 140). TE device 110 can also operate as a passive TE generator of electrical power having an output voltage proportional to a temperature differential developed by the transistor fins heating one side of TE device 110.

An isometric projection of an example TE device 110 is shown in FIG. 1B having an array of alternating p-type TE elements 111 and n-type TE elements 112. The p-type TE elements 111 and n-type TE elements 112 are in electrical series connection, connected in pairs by fin-side conductive segments 114 and back-side conductive segments 115. TE devices 110 have two interface layers 120, one above fin-side conductive segments 114 and one below back-side conductive segments 115 (opposite fins 102). Transistor 107 is shown over TE device 110 with single fin 102 and channel portions 106 connected to gate structure 103, source 104, and drain 105. Other transistors 107, though not shown in the isometric view of FIG. 1B, are also above TE device 110. Some transistors 107 have channel portions 106 in a plurality of fins 102. The TE device 110 is under arrays of transistor fins 102 but may be similarly positioned under transistor channels of an alternative architecture. In FIG. 1B, TE elements 111, 112 have dimensions of a similar scale as fins 102. TE elements 111, 112 each have widths about twice the widths of fins 102. In FIG. 1B, fins 102 have a lateral pitch about twice that of TE elements 111, 112.

The p-type TE elements 111 and n-type TE elements 112 are each pillar extending vertically between fin-side conductive segment 114 and back-side conductive segment 115. In the example shown, each TE element 111, 112 is electrically connected in series to a paired, complementary (i.e., opposite conductivity, p- or n-type) TE element by fin-side conductive segment 114, e.g., each p-type TE element 111 is connected to an n-type TE element 112 within a pair of TE elements 111, 112, and vice versa. In the example shown, each TE element 111, 112 is electrically connected in series to a complementary TE element in a different pair by a back-side conductive segment 115, e.g., each p-type TE element 111 is connected to an n-type TE element 112 in an adjacent pair of TE elements, and vice versa. Alternatively, a pair can be thought of as being intraconnected by back-side conductive segments 115 and pairs can be thought of as interconnected by fin-side conductive segments 114. In some cases, it may be helpful to think of the TE elements 111, 112 pairwise based on one end of the electrical series of TE elements 111, 112. Although an even number of TE elements 111, 112 are shown, TE devices 110 can have an odd number of elements. Further, although pairing adjacent complementary TE elements 111, 112 is convenient, e.g., for minimizing interconnects, in some embodiments, TE elements 111, 112 need not be adjacent in every instance.

The efficiencies of TE devices can improve dramatically as their dimensions are reduced, particularly as the dimensions approach, and even become less than, the electron mean free path length of their respective materials. As electron mean free path length can vary greatly, e.g., with temperature and between materials, so too can TE device dimensions. In some embodiments, device dimensions do not exceed 500 nm and, more advantageously, device dimensions do not exceed 200 nm. Other considerations may affect decisions concerning device dimensions. In some embodiments, TE elements dimensions, such as length and cross-sectional areas, may be optimized by balancing legs of complementary conduction types, for example by making TE elements larger in one or more dimensions. In some embodiments, TE elements 111, 112 are 500 nm tall. In some embodiments, each of TE elements 111, 112 has the same width as a transverse width (x-dimension) of transistor fins 102. In some embodiments, fins 102 and TE elements 111, 112 are each 10 nm wide, both with a pitch in at least one dimension (e.g., x-dimension) of 20 nm. In some embodiments, fins 102 and TE elements 111, 112 are 50 nm tall (z-dimension). In some embodiments, fins 102 are 10 nm wide with pitches of 20 nm, and TE elements 111, 112 are 40 nm wide with pitches of 100 nm, five times the fin pitch. In some embodiments, fins 102 are 40 nm tall and TE elements 111, 112 are 100 nm tall. In some embodiments, one of TE elements 111, 112 is 30 nm wide and the other is 50 nm wide with a TE element pitch of 50 nm. In some embodiments, one of TE elements 111, 112 is 20 nm wide and the other is 30 nm wide with a TE element pitch of 30 nm.

TE elements 111, 112 may comprise any material known to display the Seebeck effect and that can be patterned to nanoscale dimensions. In exemplary embodiments, TE elements 111, 112 are each a semiconductor material. Better TE materials have higher electrical conductivity and lower thermal conductivity. The thermal and electrical conductivities of metals track each other very closely, whereas these properties in semiconductors can be adjusted, e.g., by doping. In some embodiments, substrate 101 is silicon and TE elements 111, 112 are also silicon. In some embodiments, TE elements 111, 112 comprise polycrystalline silicon, which may be deposited over fin-side conductive segments 114, for example. In some embodiments, TE elements 111, 112 comprise zinc oxide, which may also be deposited upon conductive segments 114. In some embodiments, a p-type TE element 111 comprises bismuth, antimony, and tellurium with one example having alternating layers of $Bi_2Te_3$ and $Sb_2Te_3$. In some embodiments, TE elements 111, 112 comprise germanium, e.g., TE elements 111, 112 are defined from a silicon germanium substrate. In some embodiments, TE elements 111, 112 comprise indium gallium zinc oxide, which may also be deposited upon conductive segments 114, including as an amorphous material and at relatively low temperature. In some embodiments, TE elements 111, 112 comprise indium, including indium arsenide, indium gallium arsenide, or indium phosphide.

In alternative embodiments, some or all n-type TE elements 112 may instead be metallic TE elements 113. Metallic TE elements 113 may be predominantly a metal, such as Cu, or an alloy thereof.

The thermal performance of the system of IC die 100 is improved with TE devices 110 closer to transistor features, e.g., in fins 102. In some embodiments, TE device 110 is within 1000 nm of the channel portions 106 of fins 102, and more advantageously within 300 nm of the channel portions of fins 102. In some embodiments, material is removed from the back side of substrate 101 so that TE devices 110 can be closer to fins 102. In some embodiments, both TE devices beneath the separate circuitry blocks are within 1000 nm of channel portions 106 of fins 102 of their respective circuitry blocks, and heat spreader 140 is not more than 300 nm from both the first and second TE devices.

As shown, IC die 100 has multiple TE devices 110. Some circuits or circuit types can be located over dedicated TE devices 110 that are powered and/or controlled separately from other TE devices 110 located under other circuits or circuit types. For instance, some types of circuits, e.g., clock circuits, be over a first of TE devices 110 controlled separately, or in a different manner, than other types of circuits, e.g., adder circuits. In some embodiments, some TE devices 110 are controlled to be in a cooling mode concurrently while other TE devices 110 are controlled to be in a TE power generation mode. In some embodiments, some TE devices are switched from one mode in response to a control signal indicative of a local temperature proximal to a particular circuit and/or plurality of transistors. For example, while most TE devices 110 might be run as TE coolers while an associated circuit is dissipating high power, one or more TE devices 110 can be switched into TE generation mode when an associated circuit is in a low power, or sleep mode. In some embodiments, TE devices 110 are controlled into TE generation mode to momentarily serve as thermal sensors local to a particular circuit and/or plurality of transistors. Temperature differentials across TE devices 110 then generate a proportional voltage that input to a temperature control system for that circuit or for part of a circuit or location of IC die 100.

Heat spreader 140 provides a low thermal resistance path for conducting thermal energy from fins 102 to off-die, external (e.g., package-level) heat spreaders or other active-cooling structures. Heat spreader 140 advantageously comprises a material with good thermal conductivity transfer thermal energy away from fins 102. Heat spreader 140 can be an electrically insulative or electrically conductive. In some embodiments, heat spreader 140 is a ceramic material, such as diamond. In other embodiments, heat spreader 140 is a metal, such as copper. Metal heat spreaders may electrically connect to other metallization structures in IC die 100, such as ground planes.

Thermal performance of IC die 100 improves as heat spreader 140 is advantageously closer to TE devices 110 and fins 102. In some embodiments, e.g., with a back-side interface layer 120, heat spreader 140 is within 300 nm of TE elements 111, 112. In other embodiments, e.g., where heat spreader 140 has adequate electrical resistivity, back-side interface layer 120 is absent and heat spreader 140 is within 30 nm of TE elements 111, 112.

Interface layers 120 is optional to electrically insulate internal components of TE devices 110 from adjacent structures, as needed. For example, a lower interface layer 120 may thermally couple a TE device 110 to an electrically conductive and grounded copper heat spreader 140. For such embodiments, lower interface layer 120 may be formed by depositing an electrically insulating, thermally conductive material over back-side conductive segments 115 to electrically isolate but thermally couple TE device 110 to heat spreader 140. Embodiments with an electrically insulative heat spreader 140 may omit bottom interface layer 120. An upper interface layer 120 may be used above fin-side conductive segments 114 to electrically insulate internal components of TE devices 110 from, e.g., nearby fins 102, depending on proximity and applicable material properties.

Fin-side and back-side conductive segments 114, 115 are formed from electrically conductive materials and electrically connect adjacent TE elements 111, 112. Though shown in FIG. 1 as planar segments completely covering the top or bottom surfaces of TE elements 111, 112, the shapes of fin-side and back-side conductive segments 114, 115 may vary. In some embodiments, fin-side conductive segments 114 are substantially planar and cover the top surfaces of TE elements 111, 112, and back-side conductive segments 115 electrically connect adjacent, already formed TE elements 111, 112 without contacting the entirety of lower surfaces of TE elements 111, 112. In some embodiments, TE elements 111, 112 are over back-side conductive segments 115, which are substantially planar and contact the entirety of lower surfaces of TE elements 111, 112. One back-side conductive segment 115 is shown extending beyond the end of lower interface layer 120, as might another, e.g., back-side conductive segment 115, to also serve as one electrical contact for the shown TE device 110. Such an electrical contact might extend further outward substantially laterally from TE device 110 to conductive metallization structures (not shown). In some embodiments, such an electrical contact turns upward to an electrical connection at or above the level of fins 102. In some embodiments, such an electrical contact turns downward to an electrical connection, e.g., beyond an edge of, or through a hole or cutout in, heat spreader 140.

Insulating material 117 is optional to electrically, thermally, and/or mechanically separate adjacent TE elements 111, 112. In some embodiments, insulating material 117 is a mechanical support or a seed layer for other structures.

Figure 2A:
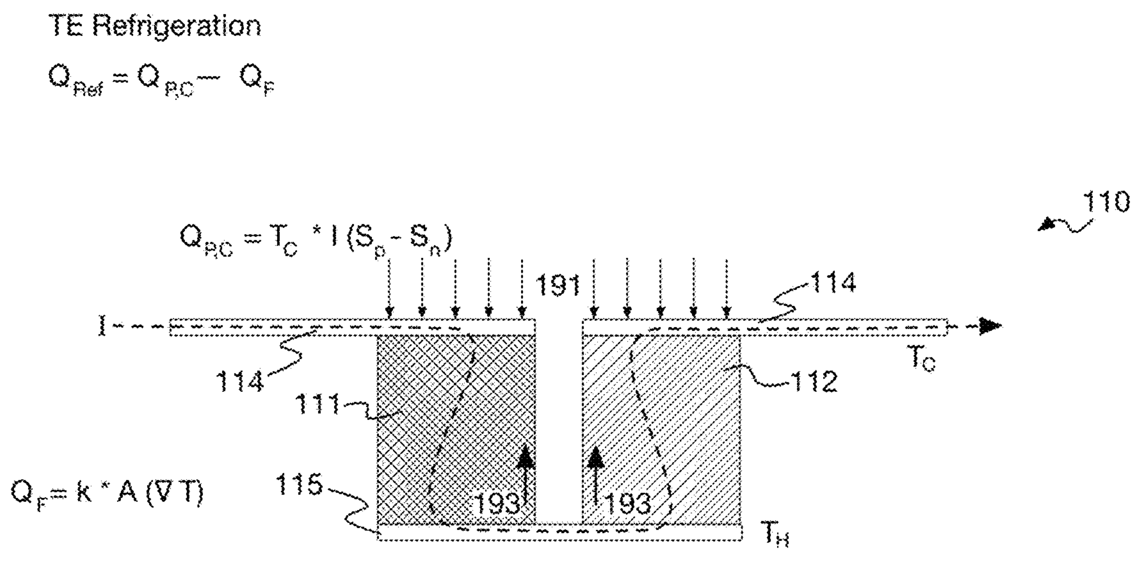
FIGS. 2A and 2B show two thermoelectric devices during different thermoelectric operations, cooling and thermoelectric generation, in accordance with some implementations of the present disclosure.
Figure 2B:
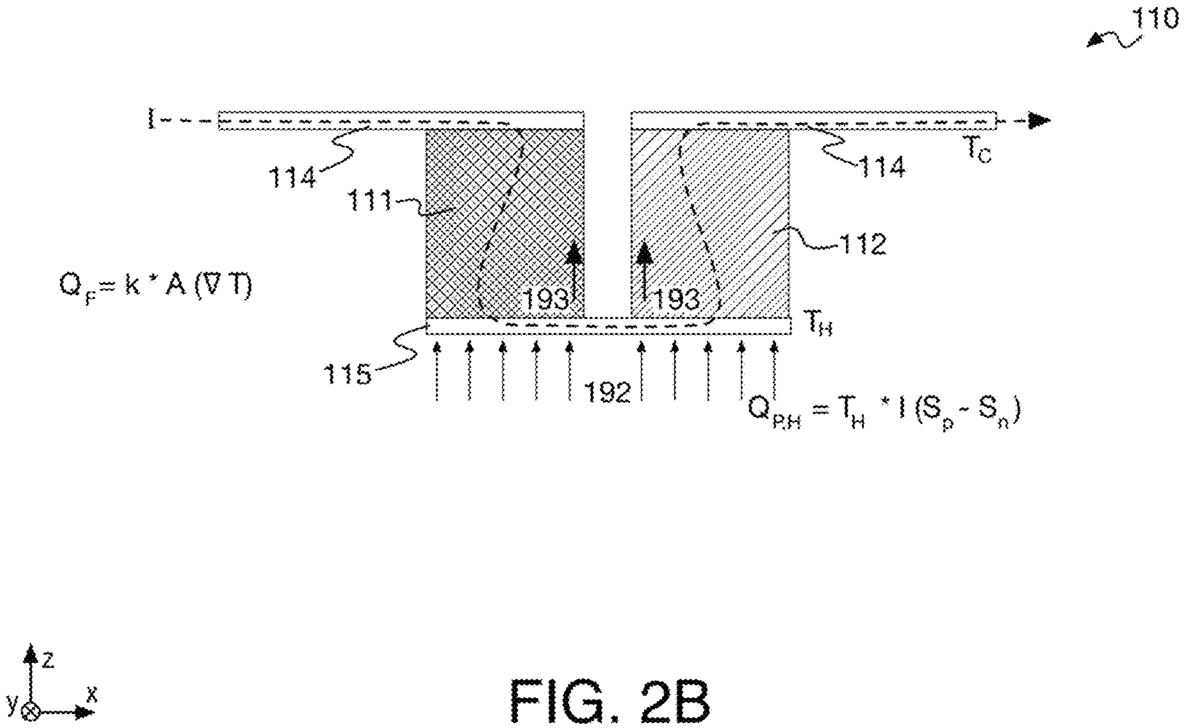

FIGS. 2A and 2B show two TE devices 110 during different TE operations, cooling and TE generation, in accordance with some implementations of the present disclosure. FIG. 2A shows a TE device 110 during TE cooling (or refrigeration), i.e., using electricity to generate a temperature differential between fin-side and back-side conductive segments 114, 115 (i.e., (upper and lower conductive segments). FIG. 2B shows the same or a similar TE device 110 during different TE generation, i.e., generating electricity from a temperature differential between fin-side and back-side conductive segments 114, 115.

In FIG. 2A, a simple TE device 110 is in cooling mode and includes p-type TE element 111 and n-type TE element 112 electrically connected by back-side conductive segment 115. Current I enters TE device 110 through a fin-side conductive segment 114 and continues into p-type TE element 111. Current I continues through back-side conductive segment 115, into n-type TE element 112, and out of TE device 110 through a fin-side conductive segment 114. In TE cooling mode, a voltage drives current I through TE device 110 and a temperature differential is developed across TE device 110. A TE refrigeration heat flux, $Q_{Ref}$, is equal to a Peltier heat flux, $Q_{P,C}$, less a waste heat flux, $Q_F$. $Q_F$ is proportional to the temperature gradient ($\nabla T=T_H-T_C$) developed across TE device 110, the natural transfer of thermal energy from hot to cold, and is shown flowing upward by arrows 193. $Q_{P,C}$, shown flowing downward, e.g., from a heat source above, into fin-side conductive segments 114 at $T_C$ by arrows 191, is proportional to the current I driven through TE device 110 and the difference in the Seebeck coefficients, $S_P$ and $S_N$, of p-type and n-type TE elements 111, 112, respectively. TE elements 111, 112 can be balanced by material selection and properly setting pillar dimensions given respective materials and their Seebeck coefficients. Though not generally as effective a TE material as semiconductor materials, metals can be used in place of n-type materials if necessary or otherwise desired.

If the direction of current I was reversed (by reversing the applied voltage), the temperature differential, $\nabla T$, would be reversed as well.

In FIG. 2B, the same or similar TE device is in TE generation mode. A Peltier (or Seebeck) heat flux, $Q_{P,H}$, generates a temperature gradient ($\nabla T=T_H-T_C$) that generates a proportional voltage, which drives current I. $Q_{P,H}$ is shown flowing upward, e.g., from a heat source below, into back-side conductive segment 115 at $T_H$ by arrows 192. $Q_{P,H}$ is proportional to the current I driven through TE device 110 and the difference in the Seebeck coefficients, $S_P$ and $S_N$, of p-type and n-type TE elements 111, 112, respectively. A waste heat flux, $Q_F$, lessens the temperature differential and so too the current I generated. If the temperature differential, ∇ T, was reversed, the direction of current I (and the generated voltage) would be reversed as well.

Figure 3:
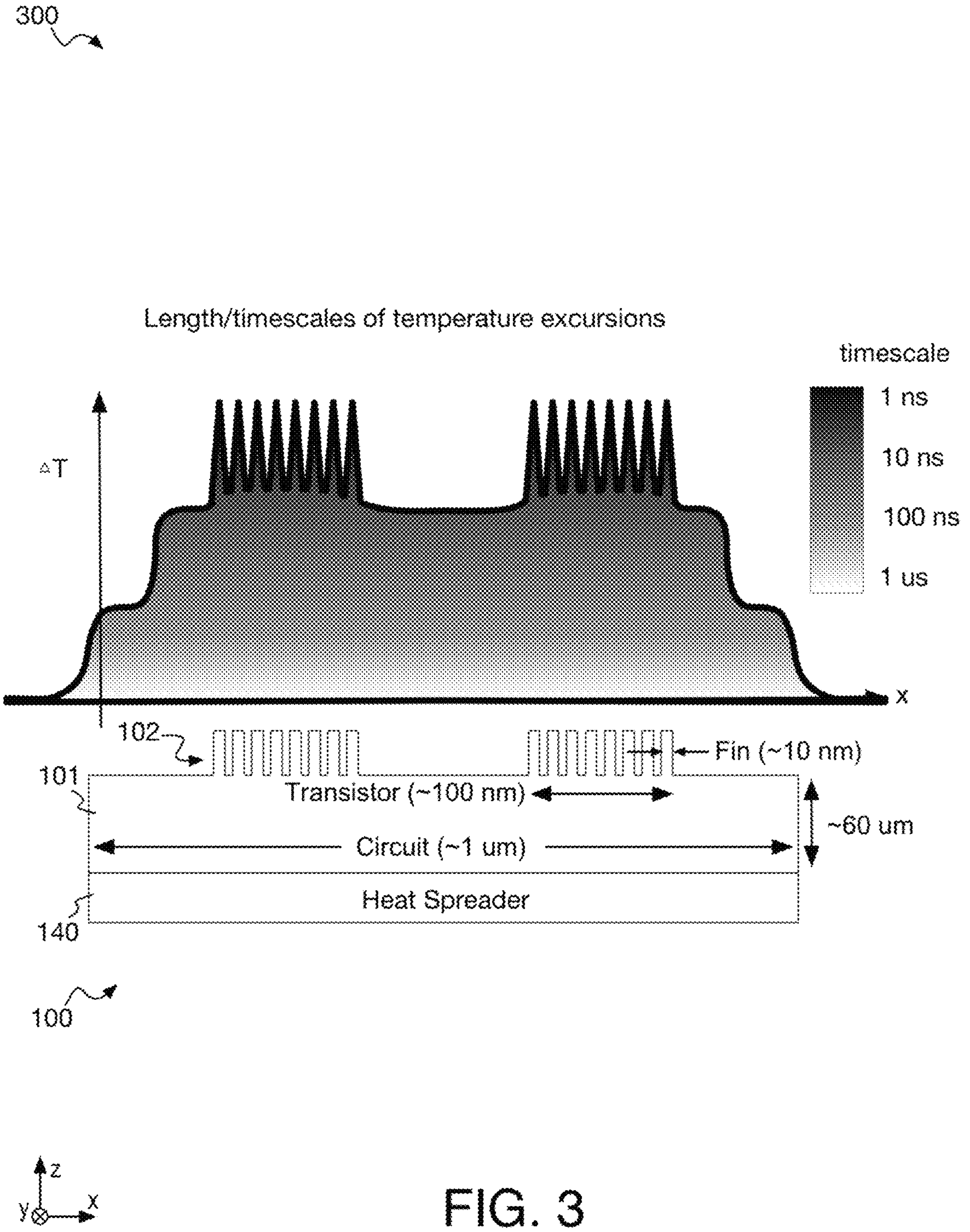
FIG. 3 illustrates a cross-sectional side view of an example IC die, including transistor fins as heat sources, in accordance with some implementations of the present disclosure.

FIG. 3 illustrates a cross-sectional side view of an example IC die 100, including transistor fins 102 as heat sources, in accordance with some implementations of the present disclosure. IC die 100 includes substrate 101, with fins 102, coupled to heat spreader 140. A plot 300 of temperature, ΔT, on the vertical axis versus position x on the horizontal axis shows the potential transient thermal effects of operating the transistors shown. The plot of ΔT is lowest at the edges of the plot and substrate 101, and ΔT peaks at numerous points along the x-axis corresponding to the positions of fins 102. Shading indicates the timescales of the thermal transients with the ΔT peaks shaded darkest, indicating their brief duration of ~1 ns, and the lowest temperatures shaded lightest, indicating their extended duration of ~1 μs. Thermal transients are smoothed out to lower ΔT values of longer duration.

The effect of heat spreader 140 can be seen by the lower temperatures at and near the edges of the plot and substrate 101 and heat spreader 140. The ΔT peaks experienced at fins 102 are of short duration but much higher ΔT than at heat spreader 140 and in substrate 101 away from the surface. This shows how the thermal transients generated at fins 102 are diffused and ultimately dissipated by heat spreader 140. The thermal performance illustrated in FIG. 3 may be improved by flattening the ΔT peaks through a more rapid thermal transport away from the sources, fins 102, and out to and through substrate 101 to heat spreader 140. Improved thermal performance reduces temperature excursions experienced by fins 102.

The thermal performance can be improved by integrating the TE devices at the dimensions described herein and by placing such device nearer transistor fins 102, as further described herein.

Figure 4:
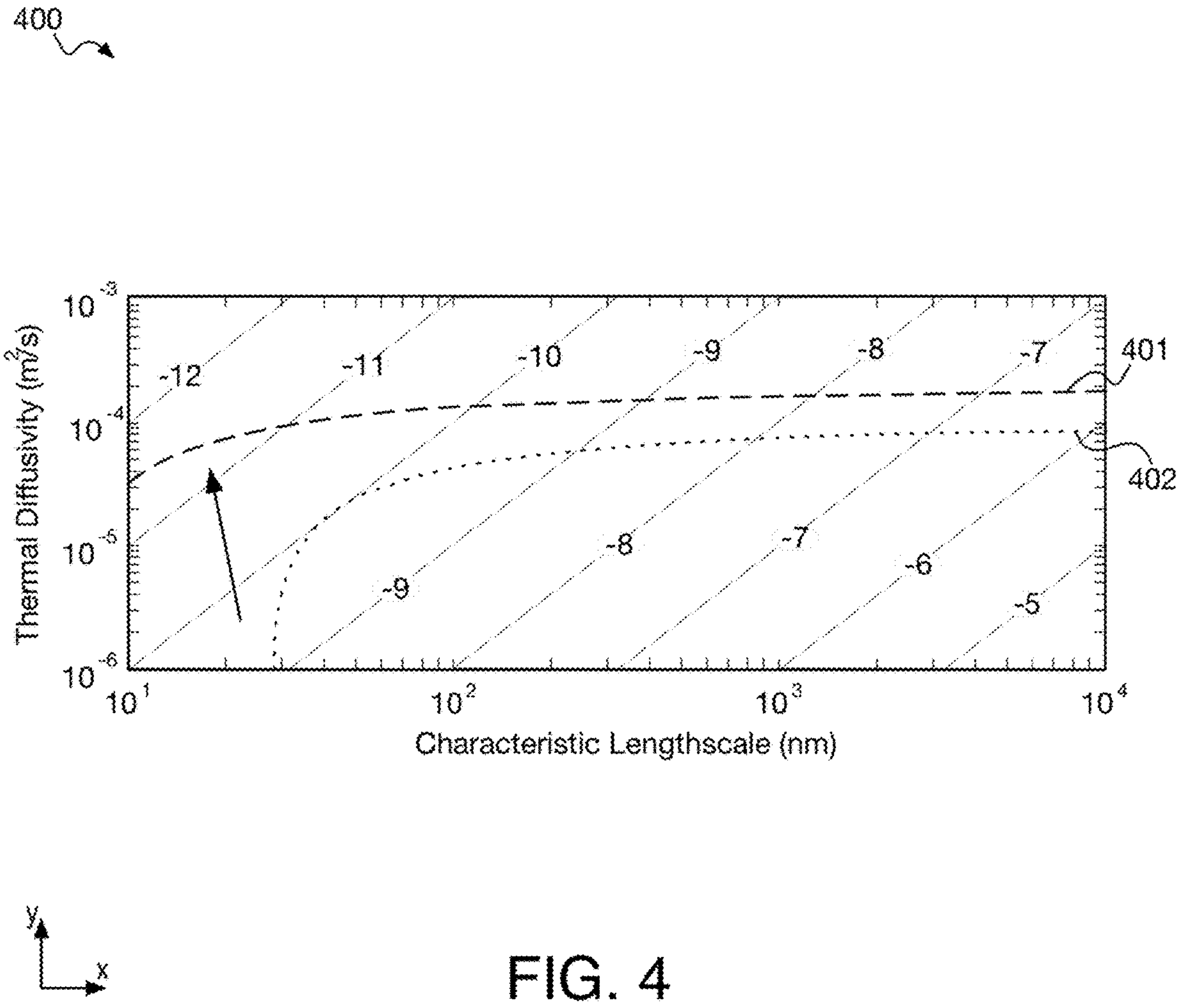
FIG. 4 illustrates improvements in the thermal performance, particularly at shorter distances, of an IC die cooling system, in accordance with some implementations of the present disclosure.

FIG. 4 illustrates improvements in the thermal performance, particularly at shorter distances, of an IC die cooling system, in accordance with some implementations of the present disclosure. In FIG. 4, simulated data is plotted in a graphical display 400. The data are plotted as functions of thermal diffusivity versus characteristic lengthscale, which illustrates the capability of a cooling system to transfer heat away from a source as a function of the distance from the heat source. Function 401 shows performance for a system with TE device in accordance with embodiments of TE device. Function 402 illustrates a comparative system lacking a TE device. Function 401 shows greater thermal diffusivity across the plotted data range, and particularly at shorter lengthscales. Function 401 illustrates a system more responsive to thermal transients at all positions in the IC die (or lengths from the heat sources), but particularly at shorter lengthscales, i.e., nearest the heat source, at the transistor channels where peak temperatures are felt.

Figure 5A:
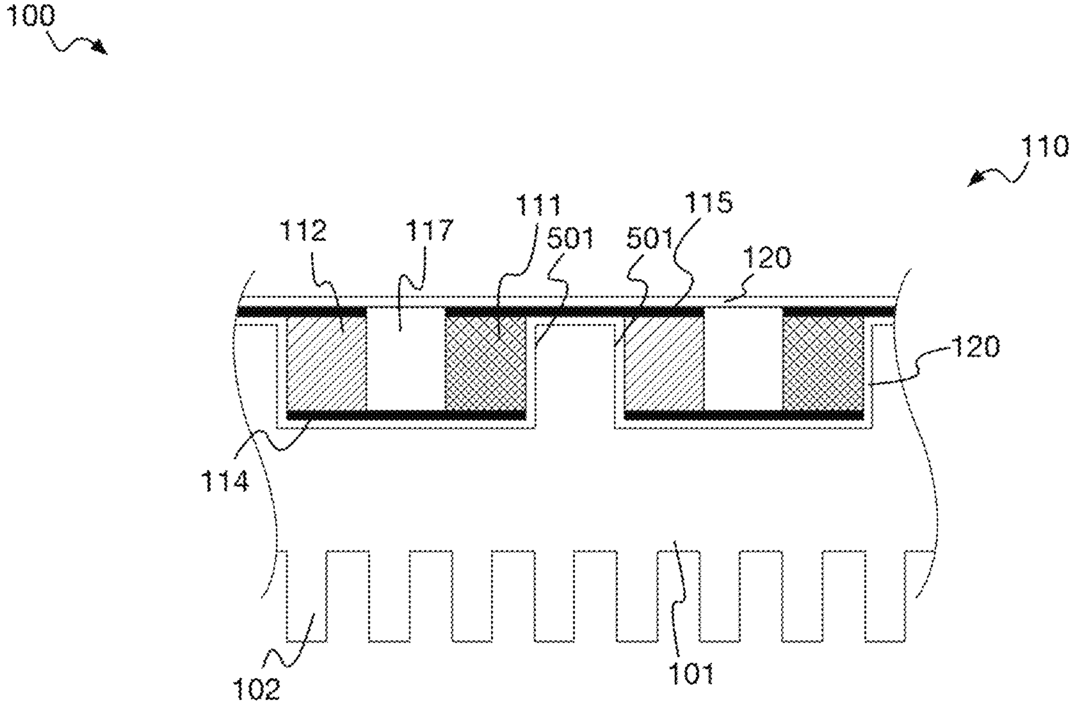
FIGS. 5A and 5B illustrate cross-sectional profile views of example IC dies, including portions of thermoelectric devices, in accordance with some implementations of the present disclosure.
Figure 5B:
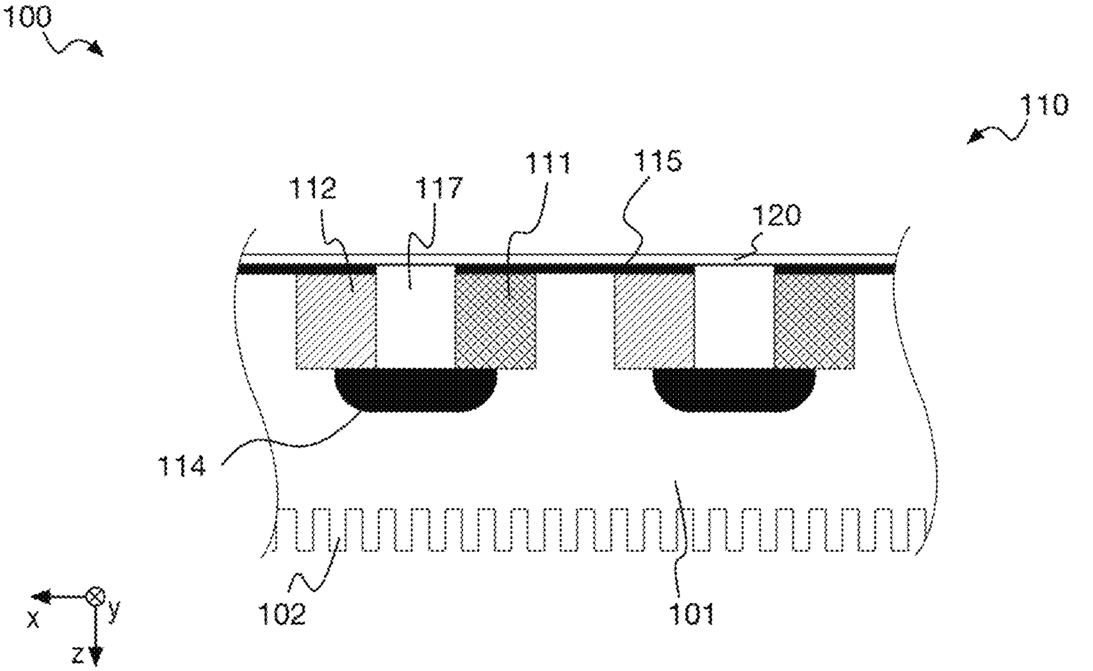

FIGS. 5A and 5B illustrate cross-sectional profile views of example IC dies 100, including portions of TE devices 110, in accordance with some implementations of the present disclosure. As shown in FIGS. 5A and 5B, TE devices 110 have been formed on the top of the back side of substrate 101. The x-, y-, and z-axes are shown in reference to those of FIG. 1, which showed similar IC dies 100 with the front or fin side up. Here, substrate 101 has been rotated to have the back side up, as would be the case during processing to form TE devices 110 after transistors were formed on the front side, as is the case here, with fins 102 seen on the front side (facing down). Due to the enlarged scale, only portions of TE devices 110 and arrays of fins 102 are shown. The dimensions of TE devices 110 are similar in scale to those of transistor fins 102, and TE devices 110 are nearer to fins 102 in the examples shown in FIGS. 5A and 5B.

FIG. 5A shows a portion of an example TE device 110 formed on a back side of substrate 101 of IC die 100. TE elements 111, 112 have dimensions of a similar scale as those of fins 102, with TE elements 111, 112 having the same height, and twice the width and pitch, as fins 102. TE elements 111, 112 have been grown over fin-side conductive segments 114. Material was removed from substrate 101 to allow TE device 110 to be formed very near to fins 102. A fin-side interface layer 120 has been formed to insulate fin-side conductive segments 114 from substrate 101 and nearby fins 102. Fin-side interface layer 120 covers the bottom of a well in substrate 101. Fin-side interface layer 120 also covers the substrate sidewalls 501 that forms the sides of the wells shown for forming TE device 110. A back-side interface layer 120 insulates back-side conductive segments 115 from nearby structures, e.g., if a conductive heat spreader is grown on or bonded to the back side of IC die 100. Insulating material 117 electrically and thermally insulates TE elements 111, 112 from each other and mechanically supports back-side interface layer 120 over back-side conductive segments 115 and insulating material 117.

FIG. 5B shows a portion of an example TE device 110 formed on a back side of substrate 101 of IC die 100. TE elements 111, 112 have dimensions of a similar scale as those of fins 102, with TE elements 111, 112 having twice the height, and no more than five times the width and/or pitch of fins 102. TE elements 111, 112 have been formed by doping portions of substrate 101. Material was removed from substrate 101 to allow TE device 110 to be formed very near to fins 102. A back-side interface layer 120 insulates back-side conductive segments 115 from nearby structures, e.g., if a conductive heat spreader is grown on or bonded to the back side of IC die 100. Insulating material 117 electrically and thermally insulates TE elements 111, 112 from each other and provided mechanical support for forming back-side interface layer 120 over back-side conductive segments 115 and insulating material 117.

Fin-side conductive segments 114 were formed (before insulating material 117 was formed) by anisotropically etching into substrate 101 (or selectively etching the substrate but not TE elements 111, 112) before isotropically etching at the bottom of the etched well. The isotropic etch formed a deeper well with undercuts under TE elements 111, 112. Fin-side conductive segments 114 were formed with conductive material in these undercut wells. Notably, similar undercuts could be etched in planes other than the cross-section shown such that fin-side conductive segments 114 contact a substantial portion of the underside of TE elements 111, 112.

Figure 6:
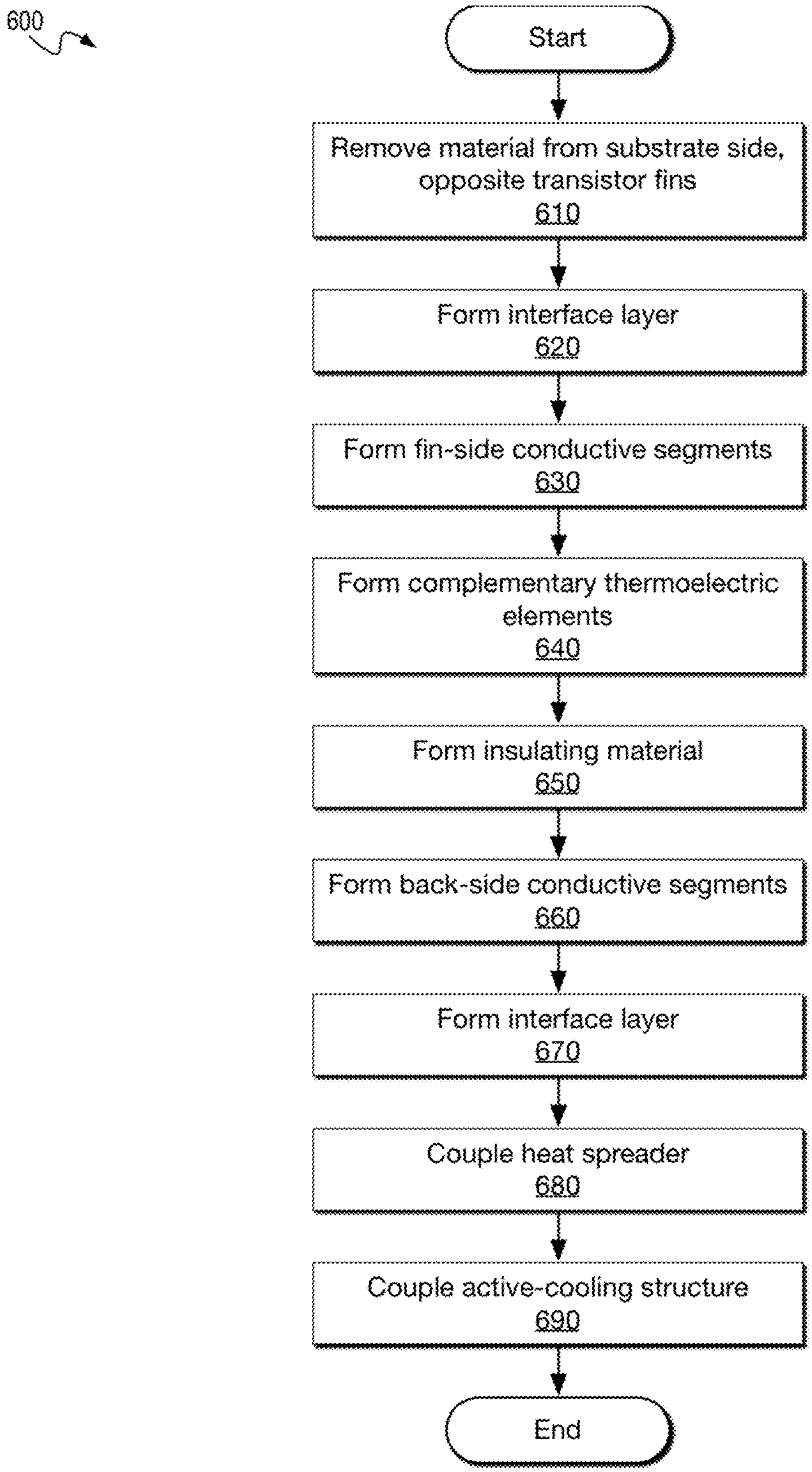
FIG. 6 illustrates various processes or methods for forming thermoelectric devices on an IC die, in accordance with some implementations of the present disclosure.

FIG. 6 illustrates various processes or methods for forming TE devices on an IC die, in accordance with some implementations of the present disclosure. FIG. 6 shows a process 600 including operations 610-690. Some operations shown in FIG. 6 are optional. FIG. 6 shows an example sequence, but the operations can be done in other sequences as well, and some operations may be omitted. Some operations can also be performed multiple times before other operations are performed. Generally, transistors are formed (e.g., fins are formed, and channels, sources, and drains are formed from the fins before gate structures are formed over the channels) on a front-side substrate of an IC die. TE devices are then formed on the back-side substrate using the further operations described below. This sequence can also be reversed. In operation 610, material can be removed from the back-side of an IC die to prepare a substrate for forming a TE device. Material may be removed to improve the efficacy of the TE device by positioning the TE device closer to transistor features. In some embodiments, back-side materials are removed and the conductors of the TE device are placed not more than 1000 nm from the channel portions of transistor fins. Material can be removed by any suitable, well-controlled method. In some embodiments, one or more etches are used. In some embodiments, mechanical means, e.g., back-side grinding, or, e.g., a laser drill, are used, sometimes in combination with an etch. In some embodiments, a single, uninterrupted void or well is formed for each TE device to be formed. In some embodiments, each TE device to be formed will have multiple wells with structures remaining between the wells to be used during later processing.

In operation 620, an interface layer can be formed, e.g., to electrically insulate the TE device from the substrate and the nearby transistors. Ideally, the interface layer can be formed from a material that is both very electrically insulative and very thermally conductive. In some embodiments, ceramic materials, such as diamond, are used. In some embodiments, the interface layer is substantially planar. In some embodiments (such as the example of FIG. 5A), the interface layer has horizontal surfaces, e.g., at the bottom of a well, and vertical surfaces over structures remaining from the substrate in or between wells. In some embodiments (such as the example of FIG. 5B), a fin-side interface layer is not used.

Returning to FIG. 6, in operation 630, conductive segments are formed to electrically connect adjacent TE elements on their fin side. Fin-side conductive segments can be formed of any suitable material. In some embodiments, fin-side conductive segments are a metal, such as copper, formed by a damascene process. In some embodiments, an electroplating process is used. In some embodiments (such as the example of FIG. 5A), the fin-side conductive segments are deposited on the exposed substrate or a fin-side interface layer, and TE elements are later formed over the conductive segments. In some embodiments, the fin-side conductive segments are formed from the front side before removing material from the back-side substrate. In some embodiments, the fin-side conductive segments are formed under already formed TE elements. In some embodiments, removal methods, e.g., etches, are used to open voids between regions of substrate that are or will subsequently become TE elements, and conductive segments are formed at the bottoms of the voids and beneath the TE elements. For example, an anisotropic etch can be used to open a void between TE elements, and an isotropic etch can be used to undercut beneath the TE elements (after, e.g., a passivation layer is formed over the sidewalls of the TE elements, or the TE elements are doped such that the isotropic etch selectively etches under them). The voids can then be filled by conductive material to form segments connecting adjacent TE elements. Such an example can be seen in FIG. 5B.

Returning to FIG. 6, in operation 640, TE elements are formed. Pairs of complementary (i.e., of opposite conductivity, p- and n-type) TE elements (sometimes referred to as pillars) are formed, and electrically connected by the conductive segments formed in operation 630. TE elements can be formed by any suitable means. In some embodiments, TE elements are patterned from the substrate, i.e., the substrate is recessed down on either side of a remaining structure that can then be doped to form either a p- or n-type element. In some embodiments, TE elements are formed as fins, with substantially longer lengths than widths. In some such embodiments, TE element fins are subsequently etched into smaller pillars with lengths similar to their widths. In some embodiments, TE elements are epitaxially grown, e.g., up over a fin-side conductive segment or laterally from a sidewall of the substrate or an interface layer covering a substrate structure that has been formed by recessing down the substrate. Grown TE elements can be doped after growth or as they are grown. TE elements defined from the substrate can be doped before or after their definition.

In operation 650, insulating material can be formed, e.g., between TE elements to electrically isolate the elements. The insulating material can also thermally insulate the hot and cold faces of the TE device from each other. In some embodiments, insulating material is grown or deposited between TE elements after they have been grown over fin-side conductive segments. In some embodiments, insulating material is grown or deposited after all of one conducting type (e.g., p-type) of TE element has been formed, and the other conducting type (e.g., n-type) of TE elements are then grown or deposited. In some embodiments, insulating material is formed over conductive segments deposited on a substrate after it has been recessed into a well, and the insulating material can then be, e.g., selectively etched for the subsequent formation of TE elements. In some embodiments, the insulating material serves as mechanical support for the subsequent formation of back-side conductive segments over the insulating material.

In operation 660, back-side conductive segments are formed to electrically connect adjacent and complementary TE elements that are not yet connected to each other. For example, if a fin-side conductive segment connects a p-type TE element to an adjacent n-type TE element to its right, a back-side conductive segment might connect the p-type TE element to an adjacent n-type TE element on its left. Back-side conductive segments can be formed of any suitable material and by any suitable means, including at least some of the materials and methods used for forming fin-side conductive segments. In some embodiments, back-side conductive segments are deposited as substantially planar metal connections over the top (back-side) faces of adjacent TE elements.

In operation 670, an interface layer is formed. Much like the fin-side interface layer, the back-side or heat spreader-side interface layer can electrically insulate the TE device from adjacent structures, e.g., a heat spreader in this case, but also thermally connect them. In some embodiments, the heat spreader is thermally conductive and electrically conductive (e.g., copper) and a back-side interface layer is formed over the TE device to electrically insulate the heat spreader from the TE device, specifically the back-side conductive segments. In some embodiments, the heat spreader is thermally conductive and electrically insulative and a back-side interface layer is not used.

In operation 680, a heat spreader is thermally coupled to the TE device. In some embodiments, the heat spreader is also separately thermally coupled to the IC die. In some embodiments, the heat spreader is grown over the substrate and an interface layer. In some embodiments, a pre-formed heat spreader is connected, e.g., bonded, to the structures.

In operation 690, an active-cooling structure is thermally coupled to the TE device. The TE device can be coupled to the active-cooling structure by the heat spreader as well as other metallization structures, including multiple metallization layers, throughout the IC die. In some embodiments, the active-cooling structure is part of the IC die and cools the IC die to below −25° C. and more advantageously below −50° C. In some embodiments, the active-cooling structure includes microchannels to convey heat transfer fluids. In some embodiments, active-cooling structures include refrigerants, including low-boiling-point fluids. In some embodiments, the active-cooling structure is connected to the IC die at the package level and cools the IC die to below −50° C. In some such embodiments, the TE device is thermally coupled to the active-cooling structure by direct connection to an on-die heat spreader, by multiple metallization layers throughout the IC die, and by a package-level heat spreader.

Figure 7:
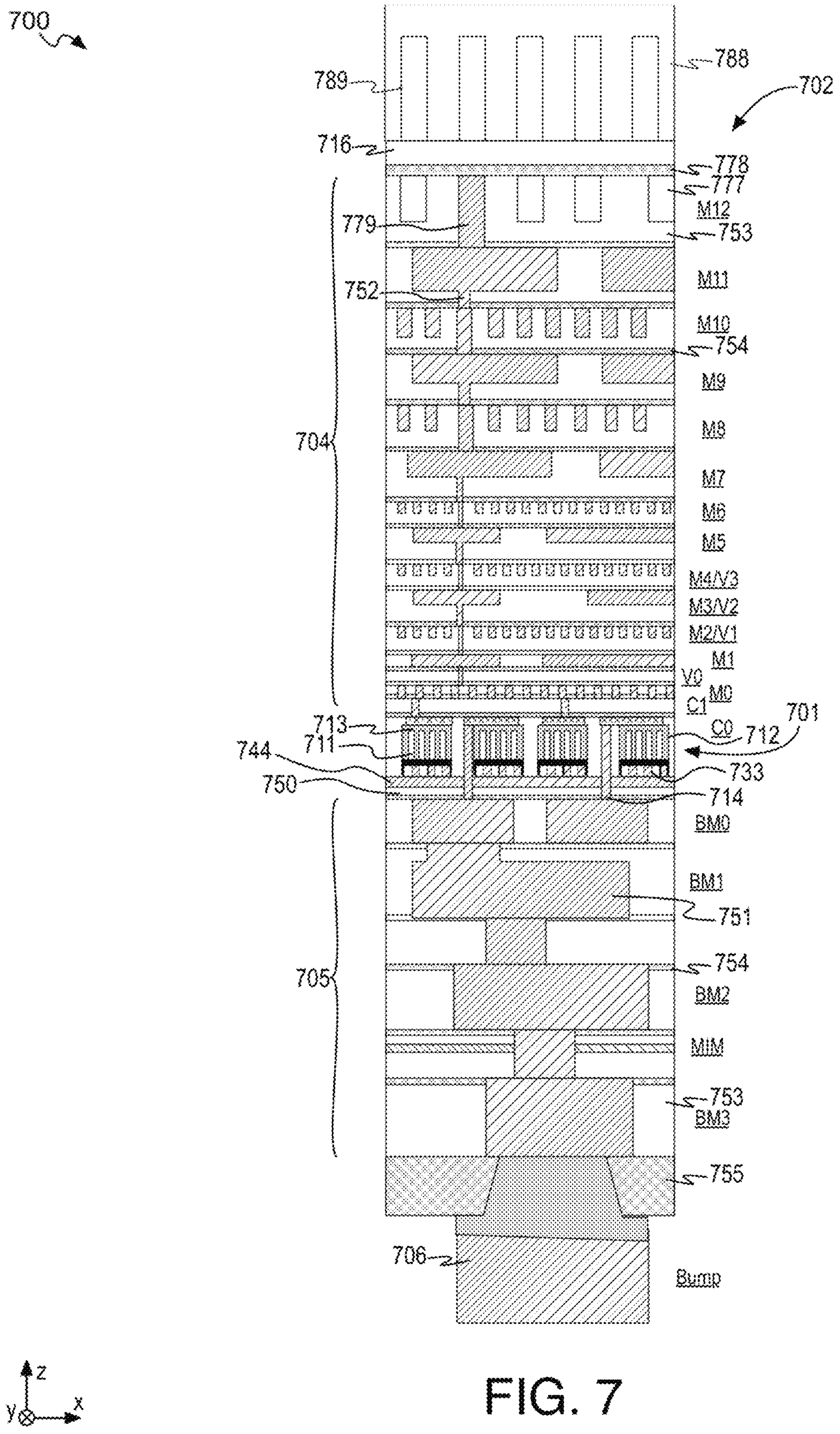
FIG. 7 illustrates a cross-sectional view of a low-temperature, integrated circuit system using die-level and package-level active cooling, arranged in accordance with at least some implementations of the present disclosure.

FIG. 7 illustrates a cross-sectional view of a low-temperature, integrated circuit system 700 using die-level and package-level active cooling, arranged in accordance with at least some implementations of the present disclosure. In the example of integrated circuit system 700, integrated circuit die 702 includes active-cooling structures or components as provided by both die-level microchannels 777 and package-level active-cooling structure 788. Integrated circuit system 700 includes a lateral surface along the x-y plane that may be defined or taken at any vertical position of integrated circuit system 700. The lateral surface of the x-y plane is orthogonal to a vertical or build-up dimension as defined by the z-axis. In some embodiments, integrated circuit system 700 may be formed from any substrate material suitable for the fabrication of transistor circuitry. In some embodiments, a semiconductor substrate is used to manufacture transistors 701 and other components of integrated circuit system 700. The semiconductor substrate may include a wafer or other piece of silicon or another semiconductor material. Suitable semiconductor substrates include, but are not limited to, single crystal silicon, poly crystalline silicon and silicon on insulator (SOI), as well as similar substrates formed of other semiconductor materials, such as gallium arsenide. The substrate may also include semiconductor materials, metals, dielectrics, dopants, and other materials commonly found in semiconductor substrates.

In FIG. 7, integrated circuit system 700 includes an integrated circuit die 702, which is a monolithic integrated circuit including non-planar transistors 701, front-side metallization layers 704 (or front-side interconnect layers), and optional back-side metallization layers 705 (or back-side interconnect layers). As shown, transistors 701 are non-planar transistors embedded within a dielectric layer 750. As shown, each of non-planar transistors 701 include channel regions 711, gate structures 712, and gate contacts 713. Each of non-planar transistors 701 also include source and drain structures, and source and drain contacts, which are not shown in the cross-section of FIG. 7. In some embodiments, front-side metallization layers 704 provide signal routing to non-planar transistors 701 and back-side metallization layers 705 provide power delivery, as enabled by through-contacts 714, to non-planar transistors 701. In some embodiments, integrated circuit system 700 further includes a package-level cooling structure 788, which may be deployed on or over front-side metallization layers 704 (as shown) or on or over a back-side of integrated circuit die 702. In some embodiments, package-level cooling structure 788 is coupled to integrated circuit die 702 by an adhesion layer 716. Integrated circuit system 700 may also be deployed without back-side metallization layers 705 shown in FIG. 7. In such embodiments, signal routing and power are provided to transistors 701 via front-side metallization layers 704. However, use of back-side metallization layers 705 may offer advantages.

Transistors 701 each have TE devices 733 formed on a back side of their respective substrates. Each TE device 733 is connected and thermally coupled to a metal heat spreader 744, which is in turn connected and thermally coupled to the entire metallization structure by through-contacts 714. In this way, TE devices 733 are thermally coupled to both the die-level active-cooling structures (of die-level microchannels 777) and package-level active-cooling structure 788.

Interconnectivity of transistors 701, signal routing to and from transistors 701, power delivery to transistors 701, and routing to an outside device (not shown), is provided by front-side metallization layers 704, optional back-side metallization layers 705, and package-level interconnects 706. In the example of FIG. 7, package-level interconnects 706 are provided on or over a back-side of integrated circuit die 702 as bumps over a passivation layer 755. However, package-level interconnects 706 may be provided using any suitable interconnect structures such as bond pads, solder bumps, etc. Furthermore, in some embodiments, package-level interconnects 706 are provided on or over a front-side of integrated circuit die 702 (i.e., over front-side metallization layers 704) and package-level cooling structure 788 is provided on or over a back-side of integrated circuit die 702 (i.e., adjacent transistors 701).

In integrated circuit system 700, integrated circuit die 702 includes die-level, active-cooling as provided by die-level microchannels 777. Die-level microchannels 777 are to convey a heat transfer fluid therein to remove heat from integrated circuit die 702. The heat transfer fluid may be any suitable liquid or gas. In some embodiments, the heat transfer fluid is liquid nitrogen operable to lower the temperature of integrated circuit die to a temperature at or below about −196° C. In some embodiments, the heat transfer fluid is a fluid with a cryogenic temperature operating window (e.g., about −180° C. to about −70° C.). In some embodiments, the heat transfer fluid is one of helium-3, helium-4, hydrogen, neon, air, fluorine, argon, oxygen, or methane.

As used herein, the term "microchannels" indicates a channel to convey a heat transfer fluid with the multiple microchannels providing discrete separate channels or a network of channels. Notably, the plural microchannels does not indicate separate channel networks are needed. Such die-level microchannels 777 may be provided in any pattern in the x-y plane such as serpentine patterns, patterns of multiple parallel die-level microchannels 777, or the like. Die-level microchannels 777 couple to a heat exchanger (not shown) that removes heat from and cools the heat transfer fluid before re-introduction to die-level microchannels 777. The flow of fluid within die-level microchannels 777 may be provided by a pump or other fluid flow device. The operation of the heat exchanger, pump, etc. may be controlled by a controller.

In the illustrated embodiment, die-level microchannels 777 are implemented at metallization level M12. In other embodiments, die-level microchannels 777 are implemented over metallization level M12. Die-level microchannels 777 may be formed using any suitable technique or techniques such as patterning and etch techniques to form the void structures of die-level microchannels 777 and passivation or deposition techniques to form a cover structure 778 to enclose the void structures. As shown, in some embodiments, the die-level, active-cooling structure of integrated circuit system 700 includes a number of die-level microchannels 777 in integrated circuit die 702 and over a number of front-side metallization layers 704. As discussed, die-level microchannels 777 are to convey a heat transfer fluid therein. In some embodiments, a metallization feature 779 of metallization layer M12 is laterally adjacent to die-level microchannels 777. For example, metallization feature 779 may couple to a package-level interconnect structure (not shown) for signal routing for integrated circuit die 702. In some embodiments, a passive heat removal device such as a heat sink or the like may be used instead of or in addition to package-level cooling structure 788. In some embodiments, package-level cooling structure 788 is not deployed in integrated circuit system 700.

As used herein, the term "metallization layer" describes layers with interconnections or wires that provide electrical routing, whether formed of metal or other material, including, e.g., graphene. Adjacent metallization layers may be formed of different materials and by different methods. Adjacent metallization layers, such as metallization interconnects 751, are interconnected by vias, such as vias 752, that may be characterized as part of the metallization layers or between the metallization layers. As shown, in some embodiments, front-side metallization layers 704 are formed over and immediately adjacent transistors 701. The back-side is then the opposite side, which may be exposed during processing by attaching the front-side to a carrier wafer and exposing the back-side (e.g., by back-side grind or etch operations) as known in the art.

In the illustrated example, front-side metallization layers 704 include M0, V0, M1, M2/V1, M3/V2, M4/V3, and M4-M12. However, front-side metallization layers 704 may include any number of metallization layers such as eight or more metallization layers. Similarly, back-side metallization layers 705 include BM0, BM1, BM2, and BM3. However, back-side metallization layers 705 may include any number of metallization layers such as two to five metallization layers. Front-side metallization layers 704 and back-side metallization layers 705 are embedded within dielectric materials 753, 754. Furthermore, optional metal-insulator-metal (MIM) devices such as diode devices may be provided within back-side metallization layers 705. Other devices such as capacitive memory devices may be provided within front-side metallization layers 704 and/or back-side metallization layers 705.

Integrated circuit system 700 includes package-level active-cooling structure 788 having package-level microchannels 789. Package-level microchannels 789 are to convey a heat transfer fluid therein to remove heat from integrated circuit die 702. The heat transfer fluid may be any suitable liquid or gas as discussed with respect to die-level microchannels 777. Package-level microchannels 789 may be provided in any pattern in the x-y plane such as serpentine patterns, patterns of multiple parallel package-level microchannels 789, etc. Package-level microchannels 789 couple to a heat exchanger (not shown) that removes heat from and cools the heat transfer fluid before re-introduction to package-level microchannels 789. The flow of fluid within package-level microchannels 789 may be provided by a pump or other fluid-flow device. The operation of the heat exchanger, pump, etc. may be controlled by a controller. In the illustrated embodiment, package-level active-cooling structure 788 is a chiller mounted to integrated circuit die 702 such that the chiller has a solid body having microchannels therein to convey a heat transfer fluid.

In some embodiments, the heat-removal fluid deployed in die-level microchannels 777 and package-level active-cooling structure 788 are coupled to the same pump and heat exchanger systems. In such embodiments, the heat removal fluid conveyed in both die-level microchannels 777 and package-level active-cooling structure 788 are the same material. Such embodiments may advantageously provide simplicity. In other embodiments, the heat removal fluids are controlled separately. In such embodiments, the heat removal fluids conveyed by die-level microchannels 777 and package-level active-cooling structure 788 may be the same or they may be different. Such embodiments may advantageously provide improved flexibility.

As discussed, integrated circuit system 700 includes integrated circuit die 702 and optional die-level and package-level active-cooling structures operable to remove heat from integrated circuit die 702 to achieve a very low operating temperature of integrated circuit die 702. As used herein, the term "very low operating temperature" indicates a temperature at or below 0° C., although even lower temperatures such as an operating temperature at or below −50° C., an operating temperature at or below −70° C., an operating temperature at or below −100° C., an operating temperature at or below −180° C., or an operating temperature at or below −196° C. may be used. In some embodiments, the operating temperature is in a cryogenic temperature operating window (e.g., about −180° C. to about −70° C.). The active-cooling structure may be provided as a package-level structure (i.e., separable from integrated circuit die 702), as a die-level structure (i.e., integral to integrated circuit die 702), or both. In some embodiments, integrated circuit die 702 is deployed in a cold environment, formed using sufficiently conductive materials, etc. and an active-cooling structure is not used.

Figure 8:
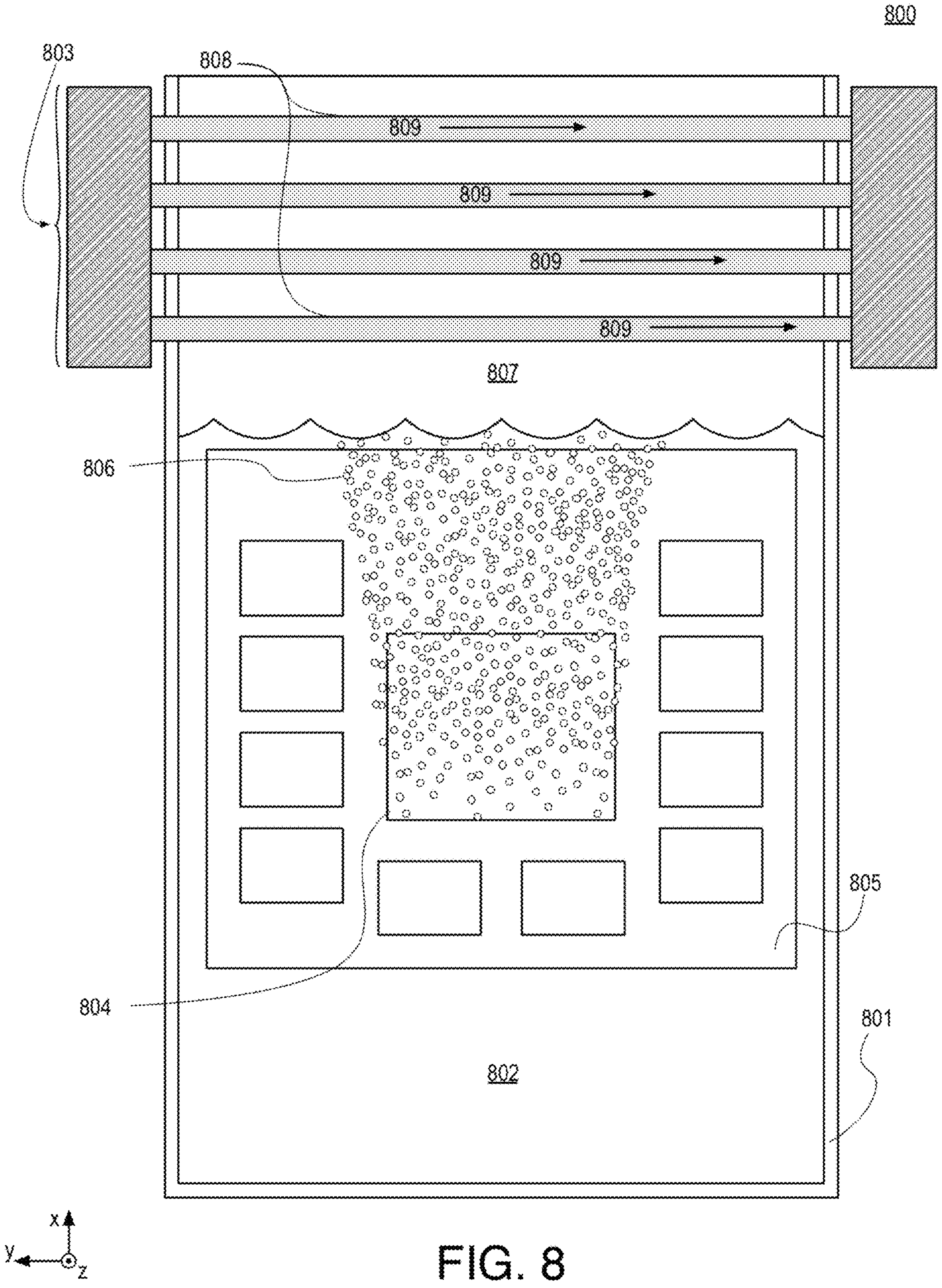
FIG. 8 illustrates a view of an example two-phase immersion cooling system for low-temperature operation of an integrated circuit die, arranged in accordance with at least some implementations of the present disclosure.

FIG. 8 illustrates a view of an example two-phase immersion cooling system 800 for low-temperature operation of an integrated circuit die, arranged in accordance with at least some implementations of the present disclosure. As shown, two-phase immersion cooling system 800 includes a fluid containment structure 801, a low-boiling point liquid 802 within fluid containment structure 801, and a condensation structure 803 at least partially within fluid containment structure 801. As used herein, the term "low-boiling point liquid" indicates a liquid having a boiling point in the very low temperature ranges discussed. In some embodiments, the low-boiling point liquid is one of helium-3, helium-4, hydrogen, neon, air, fluorine, argon, oxygen, or methane.

In operation, a heat generation source 804, such as an integrated circuit package including any of integrated circuit dies or systems 100, 700 as discussed herein is immersed in low-boiling point liquid 802. In some embodiments, integrated circuit dies or systems 100, 700 as deployed in two-phase immersion cooling system 800 do not include additional active cooling structures, although such die level or package level active cooling structures may be used in concert with two-phase immersion cooling system 800. In some embodiments, when deployed in two-phase immersion cooling system 800, package-level active-cooling structure 788 is a heat sink, a heat dissipation plate, a porous heat dissipation plate or the like.

Notably, integrated circuit die 702 (or integrated circuit die 100), is the source of heat in the context of two-phase immersion cooling system 800. For example, integrated circuit die 702 may be packaged and mounted on electronics substrate 805. Electronic substrate 805 may be coupled to a power supply (not shown) and may be partially or completely submerged in low-boiling point liquid 802.

In operation, the heat produced by heat generation source 804 vaporizes low-boiling point liquid 802 as shown in vapor or gas state as bubbles 806, which may collect, due to gravitational forces, above low-boiling point liquid 802 as a vapor portion 807 within fluid containment structure 801. Condensation structure 803 may extend through vapor portion 807. In some embodiments, condensation structure 803 is a heat exchanger having a number of tubes 808 with a cooling fluid (i.e., a fluid colder than the condensation point of vapor portion 807) shown by arrows 809 that may flow through tubes 808 to condense vapor portion 807 back to low-boiling point liquid 802. In the integrated circuit system of FIG. 8, package-level active-cooling structure 788 includes a passive cooling structure such as a heat sink for immersion in low-boiling point liquid 802.

Figure 9:
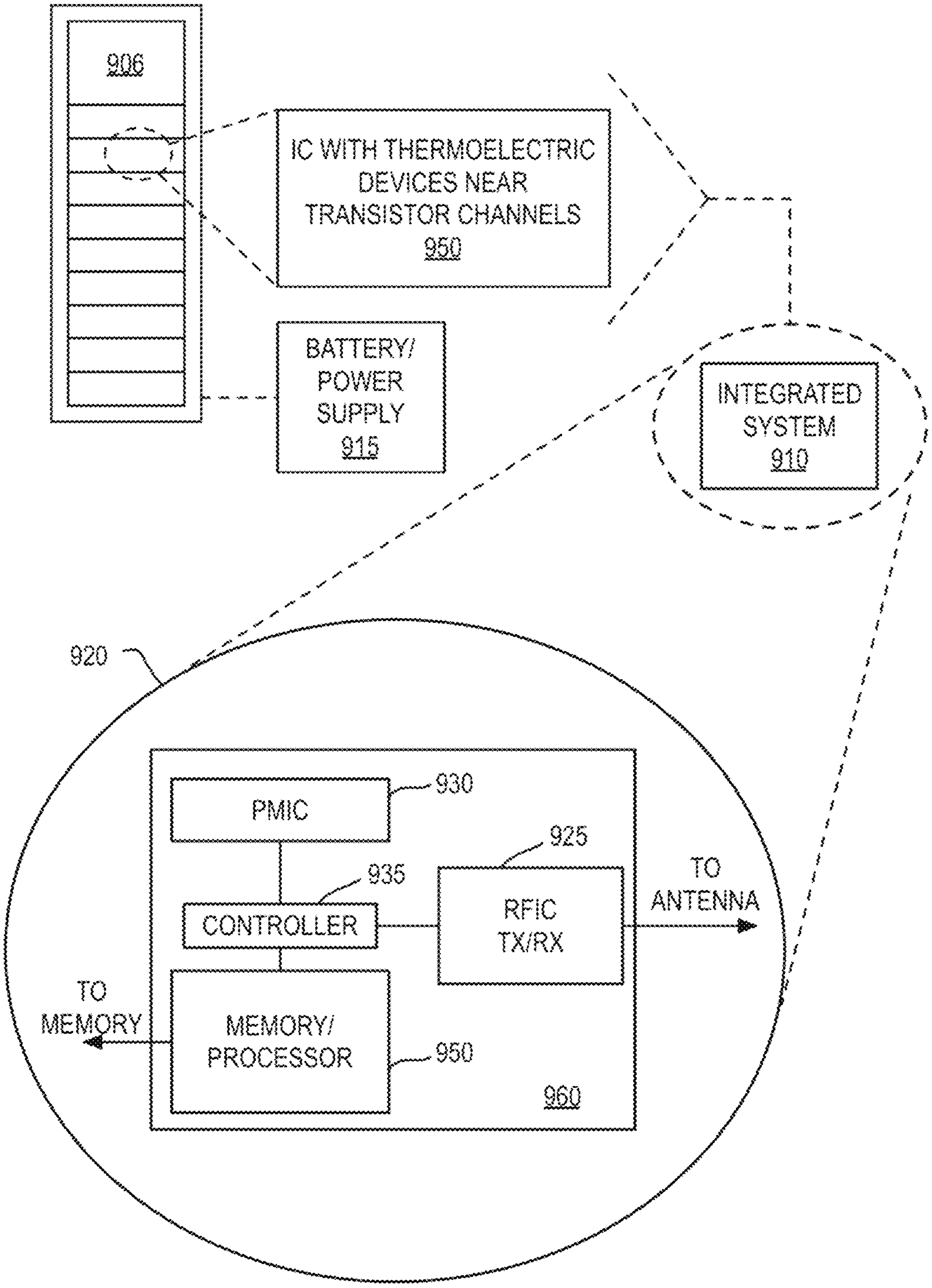
FIG. 9 illustrates a diagram of an example data server machine employing integrated circuit dies with thermoelectric devices near transistor channels, arranged in accordance with at least some implementations of the present disclosure.

FIG. 9 illustrates a diagram of an example data server machine 906 employing integrated circuit dies with TE devices near transistor channels, arranged in accordance with at least some implementations of the present disclosure. Server machine 906 may be any commercial server, for example, including any number of high-performance computing platforms disposed within a rack and networked together for electronic data processing, which in the exemplary embodiment includes one or more devices 950 having an integrated circuit with TE devices near transistor channels. In some embodiments, example data server machine 906 has low-temperature, active-cooling operable to remove heat from the integrated circuit to achieve any low operating temperature discussed herein.

Also as shown, server machine 906 includes a battery and/or power supply 915 to provide power to devices 950, and to provide, in some embodiments, power delivery functions such as power regulation. Devices 950 may be deployed as part of a package-level integrated system 910. Integrated system 910 is further illustrated in the expanded view 920. In the exemplary embodiment, devices 950 (labeled "Memory/Processor") includes at least one memory chip (e.g., RAM), and/or at least one processor chip (e.g., a microprocessor, a multi-core microprocessor, or graphics processor, or the like) having the characteristics discussed herein. In an embodiment, device 950 is a microprocessor including an SRAM cache memory. As shown, device 950 may employ a die or device having any narrow-channel, non-planar transistors and/or related characteristics discussed herein. Device 950 may be further coupled to (e.g., communicatively coupled to) a board, a substrate, or an interposer 960 along with, one or more of a power management integrated circuit (PMIC) 930, RF (wireless) integrated circuit (RFIC) 925 including a wideband RF (wireless) transmitter and/or receiver (TX/RX) (e.g., including a digital baseband and an analog front end module further comprises a power amplifier on a transmit path and a low noise amplifier on a receive path), and a controller 935 thereof.

Figure 10:
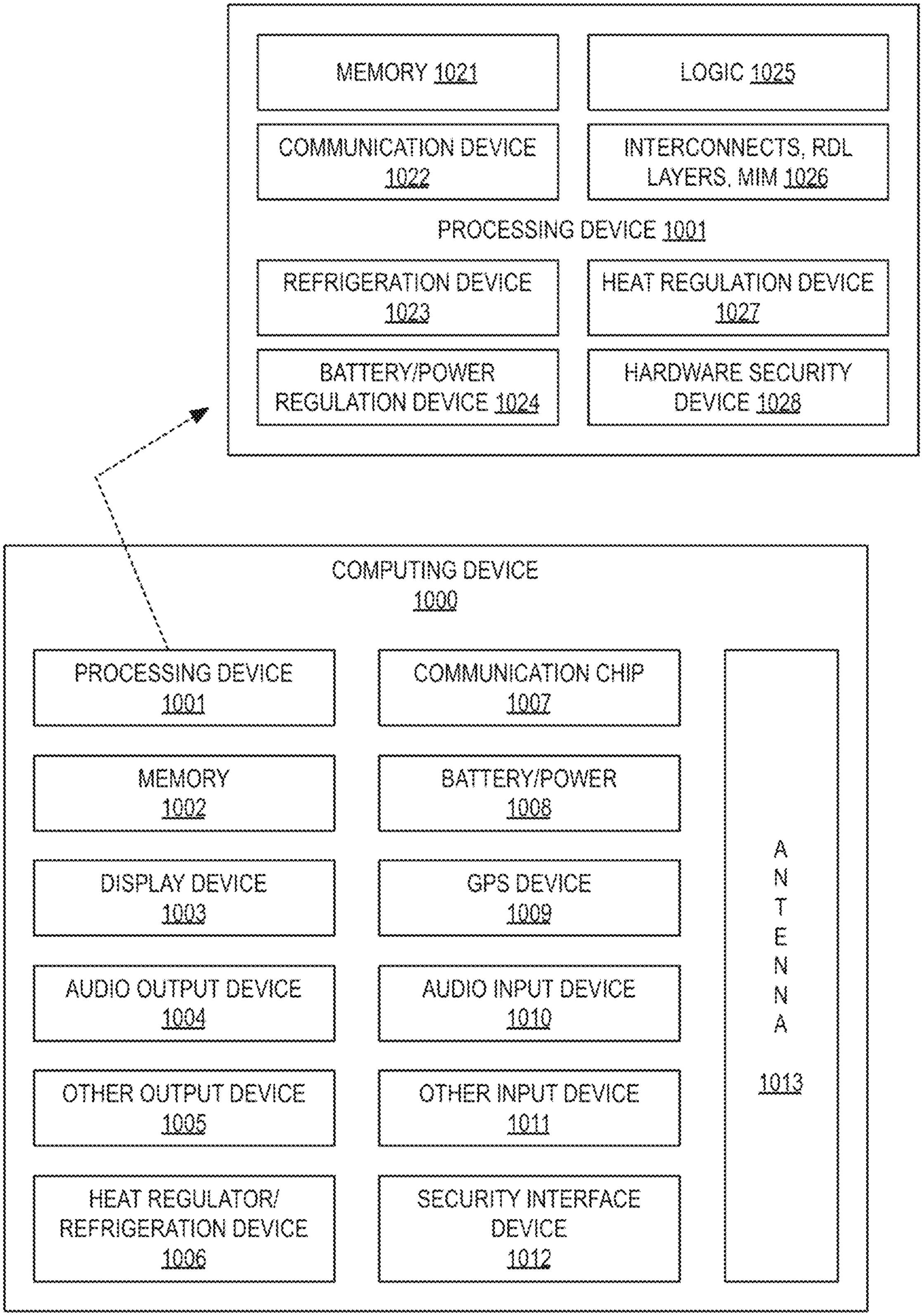
FIG. 10 is a block diagram of an example computing device, arranged in accordance with at least some implementations of the present disclosure.

FIG. 10 is a block diagram of an example computing device 1000, arranged in accordance with at least some implementations of the present disclosure. For example, one or more components of computing device 1000 may include any of the devices or structures discussed herein. A number of components are illustrated in FIG. 10 as being included in computing device 1000, but any one or more of these components may be omitted or duplicated, as suitable for the application. In some embodiments, some or all of the components included in computing device 1000 may be attached to one or more printed circuit boards (e.g., a motherboard). In some embodiments, various ones of these components may be fabricated onto a single system-on-a-chip (SoC) die. Additionally, in various embodiments, computing device 1000 may not include one or more of the components illustrated in FIG. 10, but computing device 1000 may include interface circuitry for coupling to the one or more components. For example, computing device 1000 may not include a display device 1003, but may include display device interface circuitry (e.g., a connector and driver circuitry) to which display device 1003 may be coupled. In another set of examples, computing device 1000 may not include an audio output device 1004, other output device 1005, global positioning system (GPS) device 1009, audio input device 1010, or other input device 1011, but may include audio output device interface circuitry, other output device interface circuitry, GPS device interface circuitry, audio input device interface circuitry, audio input device interface circuitry, to which audio output device 1004, other output device 1005, GPS device 1009, audio input device 1010, or other input device 1011 may be coupled.

Computing device 1000 may include a processing device 1001 (e.g., one or more processing devices). As used herein, the term "processing device" or "processor" indicates a device that processes electronic data from registers and/or memory to transform that electronic data into other electronic data that may be stored in registers and/or memory. Processing device 1001 may include a memory 1021, a communication device 1022, a refrigeration device 1023, a battery/power regulation device 1024, logic 1025, interconnects 1026 (i.e., optionally including redistribution layers (RDL) or metal-insulator-metal (MIM) devices), a heat regulation device 1027, and a hardware security device 1028.

Processing device 1001 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

Computing device 1000 may include a memory 1002, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, memory 1002 includes memory that shares a die with processing device 1001. This memory may be used as cache memory and may include embedded dynamic random-access memory (eDRAM) or spin transfer torque magnetic random-access memory (STT-M RAM).

Computing device 1000 may include a heat regulation/refrigeration device 1006. Heat regulation/refrigeration device 1006 may maintain processing device 1001 (and/or other components of computing device 1000) at a predetermined low temperature during operation. This predetermined low temperature may be any temperature discussed herein.

In some embodiments, computing device 1000 may include a communication chip 1007 (e.g., one or more communication chips). For example, the communication chip 1007 may be configured for managing wireless communications for the transfer of data to and from computing device 1000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 1007 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 1007 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 1007 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 1007 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 1007 may operate in accordance with other wireless protocols in other embodiments. Computing device 1000 may include an antenna 1013 to facilitate wireless communications and/or to receive other wireless communications (such as AM or FM radio transmissions).

In some embodiments, communication chip 1007 may manage wired communications, such as electrical, optical, or any other suitable communication protocols (e.g., the Ethernet). As noted above, communication chip 1007 may include multiple communication chips. For instance, a first communication chip 1007 may be dedicated to shorter-range wireless communications such as Wi-Fi or Bluetooth, and a second communication chip 1007 may be dedicated to longer-range wireless communications such as GPS, EDGE, GPRS, CDMA, WiMAX, LTE, EV-DO, or others. In some embodiments, a first communication chip 1007 may be dedicated to wireless communications, and a second communication chip 1007 may be dedicated to wired communications.

Computing device 1000 may include battery/power circuitry 1008. Battery/power circuitry 1008 may include one or more energy storage devices (e.g., batteries or capacitors) and/or circuitry for coupling components of computing device 1000 to an energy source separate from computing device 1000 (e.g., AC line power).

Computing device 1000 may include a display device 1003 (or corresponding interface circuitry, as discussed above). Display device 1003 may include any visual indicators, such as a heads-up display, a computer monitor, a projector, a touchscreen display, a liquid crystal display (LCD), a light-emitting diode display, or a flat panel display, for example.

Computing device 1000 may include an audio output device 1004 (or corresponding interface circuitry, as discussed above). Audio output device 1004 may include any device that generates an audible indicator, such as speakers, headsets, or earbuds, for example.

Computing device 1000 may include an audio input device 1010 (or corresponding interface circuitry, as discussed above). Audio input device 1010 may include any device that generates a signal representative of a sound, such as microphones, microphone arrays, or digital instruments (e.g., instruments having a musical instrument digital interface (MIDI) output).

Computing device 1000 may include a GPS device 1009 (or corresponding interface circuitry, as discussed above). GPS device 1009 may be in communication with a satellite-based system and may receive a location of computing device 1000, as known in the art.

Computing device 1000 may include other output device 1005 (or corresponding interface circuitry, as discussed above). Examples of the other output device 1005 may include an audio codec, a video codec, a printer, a wired or wireless transmitter for providing information to other devices, or an additional storage device.

Computing device 1000 may include other input device 1011 (or corresponding interface circuitry, as discussed above). Examples of the other input device 1011 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 1000 may include a security interface device 1012. Security interface device 1012 may include any device that provides security measures for computing device 1000 such as intrusion detection, biometric validation, security encode or decode, access list management, malware detection, or spyware detection, Computing device 1000, or a subset of its components, may have any appropriate form factor, such as a hand-held or mobile computing device (e.g., a cell phone, a smart phone, a mobile internet device, a music player, a tablet computer, a laptop computer, a netbook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The subject matter of the present description is not necessarily limited to specific applications illustrated in FIGS. 1-10. The subject matter may be applied to other deposition applications, as well as any appropriate manufacturing application, as will be understood to those skilled in the art.

The following examples pertain to further embodiments, and specifics in the examples may be used anywhere in one or more embodiments.

In one or more first embodiments, an integrated circuit (IC) die comprises a plurality of transistor structures, wherein the transistor structures comprise channel portions within fins over a first side of a substrate, a heat spreader over a second side of the substrate, and a thermoelectric (TE) device between the fins and the heat spreader, wherein the TE device comprises series connected alternating TE elements having a lateral pitch no more than five times larger than a lateral pitch of the fins.

In one or more second embodiments, further to the first embodiments, the individual ones of the TE elements are not more than 100 nm tall.

In one or more third embodiments, further to the first or second embodiments, individual ones of the fins are not more than 10 nm wide and individual ones of the TE elements are not more than 40 nm wide.

In one or more fourth embodiments, further to the first through third embodiments, the TE device is not more than 1000 nm below the fins.

In one or more fifth embodiments, further to the first through fourth embodiments, a first of the TE elements is silicon of a first conductivity type, and a second of the TE elements is either metal or silicon of a second, complementary, conductivity type.

In one or more sixth embodiments, further to the first through fifth embodiments, the TE elements comprise zinc and oxygen.

In one or more seventh embodiments, further to the first through sixth embodiments, the TE elements comprise silicon, germanium, indium, gallium, bismuth, antimony, or tellurium.

In one or more eighth embodiments, further to the first through seventh embodiments, the IC die of claim 1, wherein the heat spreader comprises copper.

In one or more ninth embodiments, further to the first through eighth embodiments, the IC die comprises or is thermally coupled to an active-cooling structure, the active-cooling structure to remove heat from an IC die to achieve an operating temperature at or below 0° C.

In one or more tenth embodiments, a system comprises a first circuitry block in a first area of an integrated circuit (IC) die, wherein the first circuitry block comprises a plurality of first transistor structures, wherein the first transistor structures comprise channel portions within first fins extending from a first side of a substrate, a second circuitry block in a second area of the IC die, wherein the second circuitry block comprises a plurality of second transistor structures, wherein the second transistor structures comprise channel portions within second fins extending from the first side of the substrate, a heat spreader over a second side of the substrate, the heat spreader extending between the first area of the IC die and the second area of the IC die, and a first thermoelectric (TE) device between the first fins and the heat spreader and a second TE device between the second fins and the heat spreader, wherein the first and second TE devices each comprise series connected alternating TE elements having a lateral pitch no more than five times larger than a lateral pitch of the first or second fins.

In one or more eleventh embodiments, further to the tenth embodiments, a power supply is coupled to power the IC die.

In one or more twelfth embodiments, further to the tenth or eleventh embodiments, the power supply has independent power connections to the first and second TE devices.

In one or more thirteenth embodiments, further to the tenth through twelfth embodiments, the first TE device is not more than 1000 nm below the first fins, the second TE device is not more than 1000 nm below the second fins, and the heat spreader is not more than 300 nm from both the first and second TE devices.

In one or more fourteenth embodiments, further to the tenth through thirteenth embodiments, individual ones of the first and second fins are not more than 10 nm wide, individual ones of the TE elements are not more than 40 nm wide, and the TE elements are not more than 1000 nm below the fins.

In one or more fifteenth embodiments, further to the tenth through fourteenth embodiments, the system comprises an active-cooling structure, the active-cooling structure to remove heat from an IC die to achieve an operating temperature at or below 0° C.

In one or more sixteenth embodiments, a method comprises forming a first array of conductors on a substrate of an integrated circuit (IC) die, wherein the IC die comprises a plurality of transistors, the transistors comprising channel portions, and the conductors are not more than 1000 nm from a plurality of channel portions of the transistors, forming an array of thermoelectric elements over the conductors, wherein the first array of conductors electrically connects adjacent thermoelectric elements of differing materials, and forming a thermoelectric device by forming a second array of conductors over the array of thermoelectric elements, wherein the second array of conductors further electrically connects adjacent thermoelectric elements of differing materials.

In one or more seventeenth embodiments, further to the sixteenth embodiments, the method further comprises exposing the substrate of the IC die by removing semiconductor material from a backside of the IC die.

In one or more eighteenth embodiments, further to the sixteenth or seventeenth embodiments, the method further comprises connecting a heat spreader to the thermoelectric device.

In one or more nineteenth embodiments, further to the sixteenth through eighteenth embodiments, the method further comprises forming an interface layer configured to electrically isolate the first array of conductors from the substrate of the IC die or to electrically isolate the second array of conductors from the heat spreader.

In one or more twentieth embodiments, further to the sixteenth through nineteenth embodiments, the array of thermoelectric elements comprises alternating elements of n-type semiconductor materials and p-type semiconductor materials.

In one or more twenty-first embodiments, further to the sixteenth through twentieth embodiments, the array of thermoelectric elements comprises alternating elements of p-type semiconductor materials and metal.

In one or more twenty-second embodiments, further to the sixteenth through twenty-first embodiments, the array of thermoelectric elements comprises silicon.

In one or more twenty-third embodiments, further to the sixteenth through twenty-second embodiments, the thermoelectric elements are not more than 100 nm tall.

It will be recognized that the disclosure can be practiced with modification and alteration, and the scope of the appended claims is not limited to the embodiments so described. For example, the above embodiments may include specific combinations of features. However, the above embodiments are not limiting in this regard and, in various implementations, the above embodiments may include the undertaking only a subset of such features, undertaking a different order of such features, undertaking a different combination of such features, and/or undertaking additional features than those features explicitly listed. The scope of the patent rights should, therefore, be determined with reference to the appended claims, along with the full scope of equivalents to which such claims are entitled.

We claim:

1. A system, comprising:

a first circuitry block in a first area of an integrated circuit (IC) die, wherein the first circuitry block comprises a plurality of first transistor structures, wherein the first transistor structures comprise channel portions within first fins extending from a first side of a substrate;

a second circuitry block in a second area of the IC die, wherein the second circuitry block comprises a plurality of second transistor structures, wherein the second transistor structures comprise channel portions within second fins extending from the first side of the substrate;

a heat spreader over a second side of the substrate, the heat spreader extending between the first area of the IC die and the second area of the IC die; and a first thermoelectric (TE) device between the first fins and the heat spreader and a second TE device between the second fins and the heat spreader, wherein the first and second TE devices each comprise series connected alternating TE elements having a lateral pitch no more than five times larger than a lateral pitch of the first or second fins.

2. The system of claim 1, further comprising a power supply coupled to power the IC die.

3. The system of claim 2, wherein the power supply has independent power connections to the first and second TE devices.

4. The system of claim 1, wherein the first TE device is not more than 1000 nm below the first fins, the second TE device is not more than 1000 nm below the second fins, and the heat spreader is not more than 300 nm from both the first and second TE devices.

5. The system of claim 1, wherein individual ones of the first and second fins are not more than 10 nm wide, individual ones of the TE elements are not more than 40 nm wide, and the TE elements are not more than 1000 nm below the fins.

6. The system of claim 1, wherein the system comprises a cooling structure, the cooling structure to remove heat from an IC die to achieve an operating temperature less than-25° C.

7. The IC die-system of claim 1, wherein:

a first of the alternating TE elements is silicon of a first conductivity type; and a second of the alternating TE elements is either metal or silicon of a second, complementary, conductivity type.

8. The system of claim 1, wherein the TE elements comprise zinc and oxygen.

9. The system of claim 1, wherein the TE elements comprise silicon, germanium, indium, gallium, bismuth, antimony, or tellurium.

10. The system of claim 1, wherein the heat spreader comprises copper.

11. The system of claim 1, wherein the IC die comprises or is thermally coupled to a cooling structure, the cooling structure to remove heat from an IC die to achieve an operating temperature at or below −25° C.

* * * * *